US011349605B2

(12) United States Patent
Myung et al.

(10) Patent No.: US 11,349,605 B2
(45) Date of Patent: *May 31, 2022

(54) RECEIVER AND METHOD FOR PROCESSING A SIGNAL THEREOF

(71) Applicant: SAMSUNG ELECTRONICS CO., LTD., Suwon-si (KR)

(72) Inventors: Se-ho Myung, Seoul (KR); Kyung-joong Kim, Seoul (KR); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/093,105

(22) Filed: Nov. 9, 2020

(65) Prior Publication Data

US 2021/0058191 A1 Feb. 25, 2021

Related U.S. Application Data

(63) Continuation of application No. 16/241,169, filed on Jan. 7, 2019, now Pat. No. 10,833,804, which is a
(Continued)

(30) Foreign Application Priority Data

Apr. 4, 2016 (KR) .......................... 10-2016-0041121

(51) Int. Cl.
*H03M 13/00* (2006.01)
*H04L 1/00* (2006.01)
(Continued)

(52) U.S. Cl.
CPC ....... *H04L 1/0057* (2013.01); *H03M 13/1105* (2013.01); *H03M 13/116* (2013.01);
(Continued)

(58) Field of Classification Search
CPC .......... H03M 13/1105; H03M 13/116; H03M 13/1165; H03M 13/255; H03M 13/2906;
(Continued)

(56) References Cited

U.S. PATENT DOCUMENTS 6,732,315 B2    5/2004   Yagil et al.
8,775,892 B2    7/2014   Zhang et al.
(Continued)

FOREIGN PATENT DOCUMENTS

JP        2011-3975 A      1/2011
JP        2013-247513 A    12/2013
(Continued)

OTHER PUBLICATIONS

International Search Report, issued by International Searching Authority in corresponding International Application No. PCT/KR2017/003691, dated Jul. 10, 2017 (PCT/ISA/210).
(Continued)

*Primary Examiner* — Christine T. Tu
(74) *Attorney, Agent, or Firm* — Sughrue Mion, PLLC

(57) ABSTRACT

A receiver is provided. The receiver includes: a first decoder configured to decode a superposition-coded signal by using a parity check matrix to generate Low Density Parity Check (LDPC) information word bits and first parity bits corresponding to a first layer signal; an encoder configured to encode the LDPC information word bits and the first parity bits to generate second parity bits, or encode the LDPC information word bits to generate the first parity bits and the second parity bits, by using the parity check matrix; and a second decoder configured to decode a signal which is generated by removing the first layer signal, corresponding to the LDPC information word bits, the first parity bits, and
(Continued)

the second parity bits, from the superposition-coded signal, to reconstruct bits transmitted through the second layer signal.

17 Claims, 15 Drawing Sheets

Related U.S. Application Data continuation of application No. 15/478,384, filed on Apr. 4, 2017, now Pat. No. 10,177,877.

(51) Int. Cl.
  *H03M 13/11*    (2006.01)
  *H03M 13/25*    (2006.01)
  *H03M 13/29*    (2006.01)
  *H03M 13/37*    (2006.01)
  *H03M 13/15*    (2006.01)

(52) U.S. Cl.
  CPC ..... *H03M 13/1165* (2013.01); *H03M 13/255* (2013.01); *H03M 13/2906* (2013.01); *H03M 13/3776* (2013.01); *H03M 13/616* (2013.01); *H03M 13/6393* (2013.01); *H04L 1/007* (2013.01); *H04L 1/0045* (2013.01); *H04L 1/0071* (2013.01); *H03M 13/152* (2013.01); *H04L 1/0065* (2013.01)

(58) Field of Classification Search
  CPC ........... H03M 13/3776; H03M 13/616; H03M 13/6393; H03M 13/6516; H03M 13/1162; H03M 13/152; H04L 1/0057; H04L 1/0045; H04L 1/007; H04L 1/0071; H04L 1/0047; H04L 1/0009; H04L 1/0065
  See application file for complete search history.

(56) References Cited

U.S. PATENT DOCUMENTS

| | | | |
|---|---|---|---|
| 2005/0003756 | A1 | 1/2005 | Sun et al. |
| 2007/0250638 | A1* | 10/2007 | Kiran ................ H04L 5/04 709/236 |
| 2010/0031118 | A1* | 2/2010 | Blanksby ............ H03M 13/13 714/752 |
| 2010/0180176 | A1 | 7/2010 | Yosoku et al. |
| 2010/0218067 | A1 | 8/2010 | Kim |
| 2010/0281330 | A1 | 11/2010 | Blanksby et al. |
| 2015/0171983 | A1 | 6/2015 | Kusashima |
| 2015/0236721 | A1 | 8/2015 | Kim et al. |
| 2016/0352462 | A1 | 12/2016 | Oh et al. |
| 2017/0012811 | A1 | 1/2017 | Park et al. |
| 2017/0026223 | A1 | 1/2017 | Park et al. |
| 2017/0064645 | A1 | 3/2017 | Taherzadeh Boroujeni et al. |
| 2017/0093527 | A1 | 3/2017 | Jeong et al. |
| 2017/0294981 | A1* | 10/2017 | Kim .............. H04W 72/0466 |
| 2019/0068318 | A1 | 2/2019 | Marinier et al. |

FOREIGN PATENT DOCUMENTS

| | | |
|---|---|---|
| KR | 10-0634940 B1 | 10/2006 |
| KR | 10-2015-0100569 A | 9/2015 |
| WO | 2015170819 A1 | 11/2015 |
| WO | 2016032196 A1 | 3/2016 |

OTHER PUBLICATIONS

Written Opinion issued by the International Bureau in corresponding International Application No. PCT/KR2017/003691, dated Jul. 10, 2017 (PCT/ISA/237).

* cited by examiner

RECEIVER AND METHOD FOR PROCESSING A SIGNAL THEREOF

CROSS-REFERENCE TO THE RELATED APPLICATION

This is a continuation of U.S. application Ser. No. 16/241,169, filed Jan. 7, 2019, which is a continuation of U.S. application Ser. No. 15/478,384, filed Apr. 4, 2017, now U.S. Pat. No. 10,177,877, issued Jan. 8, 2019, which claims priority from Korean Patent Application No. 10-2016-0041121, filed Apr. 4, 2016, in the Korean Intellectual Property Office, the disclosures of which are incorporated herein by reference in their entireties.

BACKGROUND

1. Field

Apparatus and methods consistent with exemplary embodiments relate to a receiver and a method for processing a signal thereof, and more particularly, to a receiver for receiving and processing a signal generated by superposition coding and a method for processing a signal thereof.

2. Description of the Related Art

In the 21st century's information-oriented society, a broadcasting communication service is entering an era of full-blown multi-channels, wide bands, and high quality. Further, with the popularization of a high-definition digital television (TV), a Portable Multimedia Player (PMP), and a portable broadcasting device, there are increasing demands for a digital broadcasting service supporting diverse receiving methods.

When a receiver processes a signal generated by superposition coding, the receiver uses an upper layer signal with relatively more power to receive a base layer signal with relatively less power.

Accordingly, a longer processing time of the upper layer signal results in a longer processing time of the base layer signal, because the upper layer signal is decoded to receive the base layer signal. With the longer decoding time of the upper layer signal, the processing time of the base layer signal increases.

In this regard, there is a necessity for a method for processing a superposition-coded signal efficiently by reducing the decoding time of the upper layer signal.

SUMMARY

The exemplary embodiments of the inventive concept are provided to address the aforementioned and other problems and disadvantages occurring in the related art, and the exemplary embodiments provide a receiver that decodes an upper layer signal by means of a part of a parity check matrix in order to reduce the decoding time of the upper layer signal with low error probability and a method for processing a signal thereof.

According to an exemplary embodiment, there is provided a receiver for receiving and processing a superposition-coded signal. The receiver may include: a first decoder configured to decode a superposition-coded signal by using a parity check matrix to generate Low Density Parity Check (LDPC) information word bits and first parity bits corresponding to a first layer signal; an encoder configured to encode the LDPC information word bits and the first parity bits to generate second parity bits, or encode the LDPC information word bits to generate the first parity bits and the second parity bits, by using the parity check matrix; and a second decoder configured to decode a signal which is generated by removing the first layer signal, corresponding to the LDPC information word bits, the first parity bits, and the second parity bits, from the superposition-coded signal, to reconstruct bits transmitted through the second layer signal.

The parity check matrix may include: a first parity check matrix including a first parity sub-matrix which is a dual diagonal matrix with respect to a first information word sub-matrix; and a second parity check matrix including a second parity sub-matrix which is a unit matrix with respect to a second information word sub-matrix.

The first parity bits may correspond to the first parity sub-matrix, and the second parity bits may correspond to the second parity sub-matrix.

The first decoder may decode the superposition-coded signal by using the first parity check matrix.

The first decoder may decode the superposition-coded signal by using the entire first parity check matrix and a part of the second parity check matrix.

The first decoder may decode the superposition-coded signal by using the entire parity check matrix or a part of the parity check matrix before the number of times of iterations exceeds a predetermined number of times during the decoding, and decode the superposition-coded signal by using the first parity check matrix in response to the number of times of the iterations exceeding the predetermined number of times. Here, the number of times of the iterations is the number of times of passing messages between variable nodes and check nodes of a corresponding parity check matrix among the entire parity check matrix, the part of the parity check matrix, and the first parity check matrix.

The first decoder may decode the superposition-coded signal by using the entire first parity check matrix and at least one sub-matrix among a plurality of sub-matrixes of the second parity check matrix.

The plurality of sub-matrixes may include a part of each of the second information word sub-matrix and the second parity sub-matrix.

The encoder may encode the LDPC information word bits and the first parity bits by using the second parity check matrix to generate the second parity bits corresponding to the second parity sub-matrix.

In response to determining that an LDPC syndrome value satisfies a predetermined value according to a syndrome check result with respect to the LDPC information word bits and the first parity bits based on the first parity check matrix, the encoder may encode the LDPC information word bits and the first parity bits by using the second parity check matrix to generate the second parity bits corresponding to the second parity sub-matrix.

In response to determining that the LDPC syndrome value does not satisfy the predetermined value, the first decoder may decode the LDPC information word bits, and the encoder may encode the LDPC information word bits by using the parity check matrix to generate the first parity bits corresponding to the first parity sub-matrix and the second parity bits corresponding to the second parity sub-matrix.

The parity check matrix may differ from a parity check matrix used by the second decoder to decode the bits transmitted through the second layer signal.

According to an exemplary embodiment, there is provided a method for receiving and processing a superposition-coded signal generated from a first layer signal and a second layer signal. The method may include: decoding the superposition-coded signal by using a parity check matrix to generate Low Density Parity Check (LDPC) information word bits and first parity bits corresponding to the first layer signal; encoding the LDPC information word bits and the first parity bits to generate second parity bits, or encoding the LDPC information word bits to generate the first parity bits and the second parity bits, by using the parity check matrix; and decoding a signal which is generated by removing the first layer signal, corresponding to the LDPC information word bits, the first parity bits, and the second parity bits, from the superposition-coded signal, to reconstruct bits transmitted through the second layer signal.

The parity check matrix may include a first parity check matrix including a first parity sub-matrix which is a dual diagonal matrix with respect to a first information word sub-matrix and a second parity check matrix including a second parity sub-matrix which is a unit matrix with respect to a second information word sub-matrix.

The first parity bits may correspond to the first parity sub-matrix, and the second parity bits may correspond to the second parity sub-matrix.

The generating the LDPC information word bits and the first parity bits may include decoding the superposition-coded signal by using the first parity check matrix.

The generating the LDPC information word bits and the first parity bits may include decoding the superposition-coded signal by using the entire first parity check matrix and a part of the second parity check matrix.

The generating the LDPC information word bits and the first parity bits may include decoding the superposition-coded signal by using the entire parity check matrix or a part of the parity check matrix before the number of times of iterations exceeds a predetermined number of times during the decoding and decoding the superposition-coded signal by using the first parity check matrix in response to the number of times of the iterations exceeding the predetermined number of times.

The generating the LDPC information word bits and the first parity bits may include decoding the superposition-coded signal by using the entire first parity check matrix and at least one sub-matrix among a plurality of sub-matrixes of the second parity check matrix.

The plurality of sub-matrixes may include a part of each of the second information word sub-matrix and the second parity sub-matrix.

The generating the second parity bits may include generating the second parity bits corresponding to the second parity sub-matrix by encoding the LDPC information word bits and the first parity bits by using the second parity check matrix.

The parity check matrix may differ from a parity check matrix used to decode the bits transmitted through the second layer signal.

According to the above-described various exemplary embodiments, the receiver uses a part of a parity check matrix when decoding an upper layer signal. Accordingly, the receiver may reduce decoding complexity with low error probability, thereby decreasing the decoding time of the upper layer signal.

BRIEF DESCRIPTION OF DRAWINGS

The above and/or other aspects of the inventive concept will be more apparent by describing certain exemplary embodiments with reference to the accompanying drawings, in which.

DETAILED DESCRIPTION OF EXEMPLARY EMBODIMENT

Figure 1:
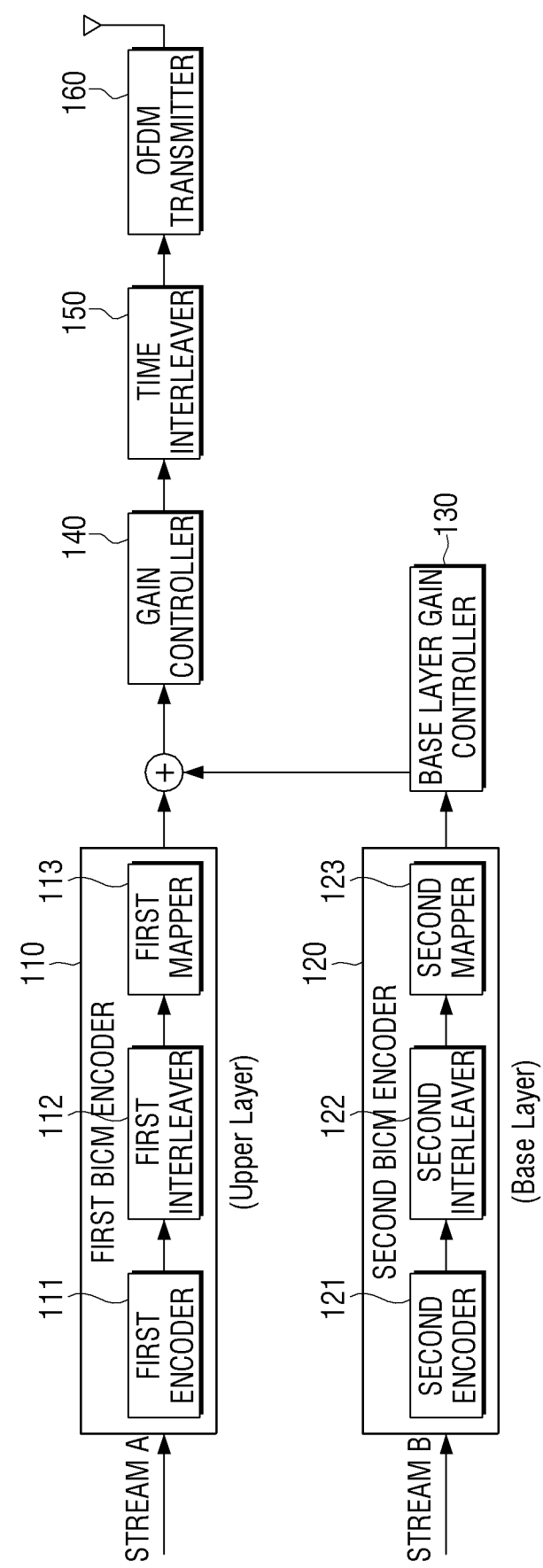
FIG. 1 is a block diagram illustrating a transmitter according to an exemplary embodiment.

Certain exemplary embodiments are described below in greater detail with reference to the accompanying drawings.

In the following description, like drawing reference numerals are used for the like elements, even in different drawings. The matters defined in the description, such as detailed construction and elements, are provided to assist in a comprehensive understanding of embodiments. However, embodiments can be practiced without those specifically defined matters. Also, well-known functions or constructions are not described in detail since they would obscure the application with unnecessary detail.

According to exemplary embodiments disclosed herein, a receiver may receive a signal generated by superposition coding (hereinafter referred to as 'superposition-coded signal') and reconstruct respective signals before the superposition coding.

The superposition coding refers to a coding method of superimposing or overlapping signals including the same or different data to have different levels of power. In this case, a signal with relatively more power in the superposition-coded signal forms a first layer, that is, an upper layer, and a signal with relatively less power forms a second layer, that is, a base layer.

A transmitter that generates and transmits a superposition-coded signal may include components illustrated in FIG. 1. However, the structure of a transmitter 100 of FIG. 1 is only an example. That is, the transmitter 100 may be configured to omit a part of the components of FIG. 1 or further include another component for other processing operations, needless to say.

Referring to FIG. 1, the transmitter 100 includes a first Bit Interleaved Coded Modulation (BICM) encoder 110 which includes a first encoder 111, a first interleaver 112, and a first mapper 113 (or first constellation mapper). Accordingly, the transmitter 100 may encode, interleave and modulate information word bits. For the modulation, the first mapper 113 maps the information word bits onto constellation points (in this case, the information word bits are data and belong to Stream A of FIG. 1).

Further, the transmitter 100 may include a second BICM encoder 120 which includes a second encoder 121, a second interleaver 122, and a second mapper 123 (or second constellation mapper). Accordingly, the transmitter 100 may encode, interleave and modulate information word bits. For the modulation, the second mapper 123 map the information word bits onto constellation points (in this case, the information word bits are data and belong to Stream B of FIG. 1).

The first and second encoders 111, 121 each may include an outer encoder (not shown) and an inner encoder (not shown) to encode the information word bits by concatenated coding.

For the concatenated coding, outer coding may be executed before inner coding in diverse encoding methods such as Bose, Chaudhuri, Hocquenghem (BCH) coding, Cyclical Redundancy Check (CRC) coding, and/or the like. The inner coding may be executed in diverse encoding methods such as a Low density parity check (LDPC) coding, and/or the like.

In the above example, the first and second encoders 111, 121 encode input bits by the concatenated coding, but this is only an example for illustrative purpose. That is, the first and second encoders 111, 121 may encode the input bits by using one encoding method.

The following embodiment will be described based on an assumption that the first and second encoders 111, 121 each encode the input bits by concatenating a BCH code and an LDPC code through a BCH encoder (not shown) and an LDPC encoder (not shown), respectively.

In this case, the first and second encoders 111, 121 may BCH encode input bits (namely, information word bits) to generate BCH parity bits, and LDPC encode a BCH codeword including the information word bits and BCH parity bit, namely, LDPC information word bits to generate LDPC parity bits.

Figure 2:
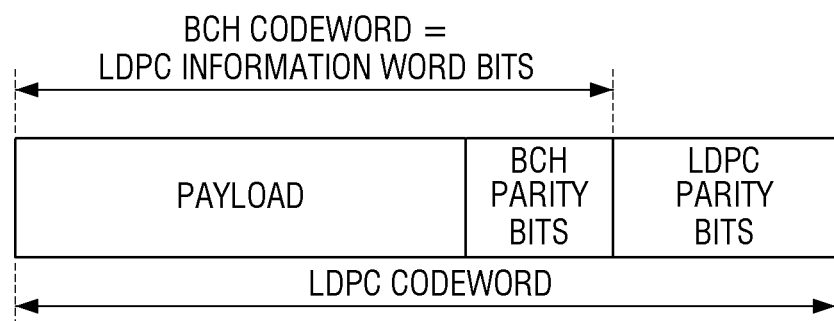
FIG. 2 is a diagram provided to describe an LDPC codeword according to an exemplary embodiment.

The LDPC codeword generated by the above encoding operations may be depicted as in FIG. 2. As illustrated in FIG. 2, the LDPC codeword may have a form where the BCH parity bits and the LDPC parity bits are added to the information word bits sequentially.

The LDPC encoder may encode the LDPC information word bits according to various code rates, and generate LDPC codewords with various lengths.

For example, the LDPC encoder may encode the LDPC information word bits with the code rates of 3/15, 4/15, 5/15, 6/15, 7/15, 8/15, 9/15, 10/15, 11/15, 12/15, and 13/15, and generate the LDPC codewords with the length of 16200 or 64800 bits.

The transmitter 100 generates a superposition-coded signal by adjusting a gain (that is, power) with respect to a signal output from the second BICM encoder 120 through a base layer gain controller 130, and then superposing the signal with the adjusted gain on a signal output from the first BICM encoder 110.

Figure 6:
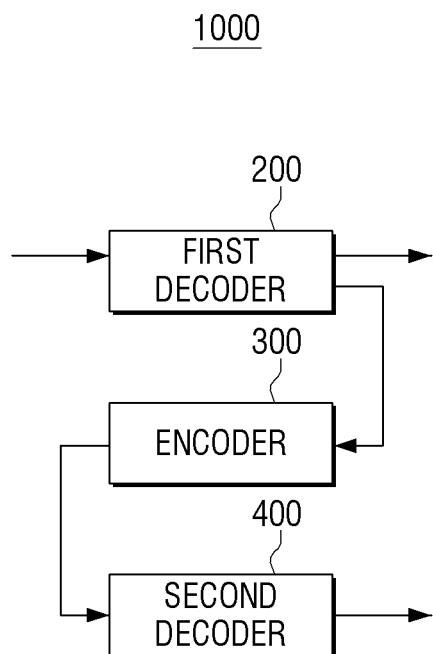
FIG. 6 is a block diagram illustrating a structure of a receiver according to an exemplary embodiment.

Subsequently, the transmitter 100 may adjust a gain with respect to the superposition-coded signal through a gain controller 140, interleaves constellation points where the superposition-coded signal is mapped, namely, cells through a time interleaver 150, map the interleaved cells onto an Orthogonal Frequency Division Multiplexing (OFDM) frame through an OFDM transmitter 160, and transmit the cells to a receiver 1000 (FIG. 6).

Figure 3:
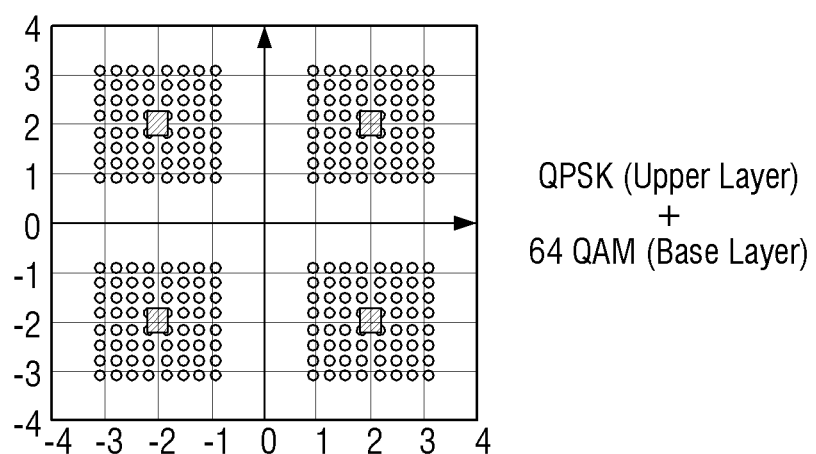
FIG. 3 is a diagram provided to describe an example of constellation of a superposition-coded signal according to an exemplary embodiment.

FIG. 3 is a diagram provided to describe an example of constellation of a superposition-coded signal according to an exemplary embodiment.

Referring to FIG. 3, an upper layer signal is modulated according to Quadrature Phase Shift Keying (QPSK), and a base layer signal is modulated according to 64-Quadrature Amplitude Modulation (QAM). That is, in the superposition-coded signal, the constellation points of the base layer signal with relatively less power are superposed with reference to the constellation points of the upper layer signal with relatively more power.

FIG. 3 illustrates an example where the upper layer signal is modulated according to the QPSK, and the base layer signal is modulated according to the 64-QAM. However, this is only an example for illustrative purpose, and the upper layer signal may be modulated according to the QPSK, and the base layer signal may be modulated according to 256-QAM. That is, diverse modulation methods may be applied to each layer signal.

Figure 4:
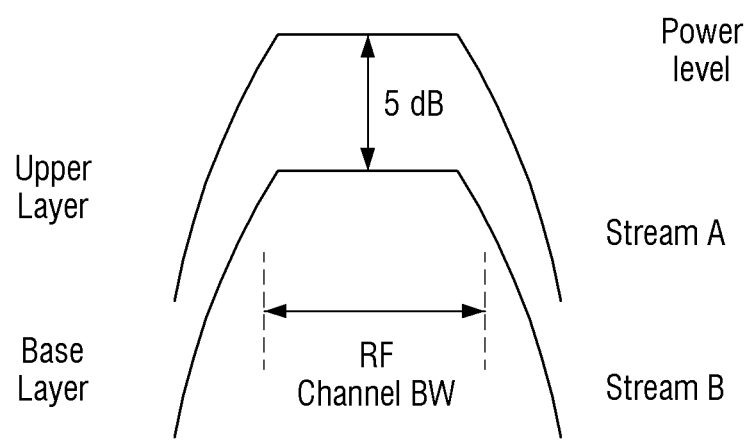
FIG. 4 is a diagram provided to describe an example of power with respect to a superposition-coded signal according to an exemplary embodiment.

FIG. 4 is a diagram provided to describe an example of power with respect to a superposition-coded signal according to an exemplary embodiment. As illustrated in FIG. 4, the power of the upper layer signal may be 5 dB greater than the power of the base layer signal in a Radio Frequency (RF) channel band.

The LDPC encoding operation is a process of generating an LDPC codeword that satisfies $H \cdot C^T = 0$ with respect to LDPC information word bits. In this case, H denotes a parity check matrix, and C denotes the LDPC codeword. That is, the LDPC encoding operation is a process of generating parity bits where a product of each column of the parity check matrix and each bit of the LDPC codeword is '0' vector.

Accordingly, the transmitter 100 may pre-store the parity check matrix by means of a memory (not shown), and the LDPC encoder may encode the LDPC information word bits by using the parity check matrix.

Figure 5:
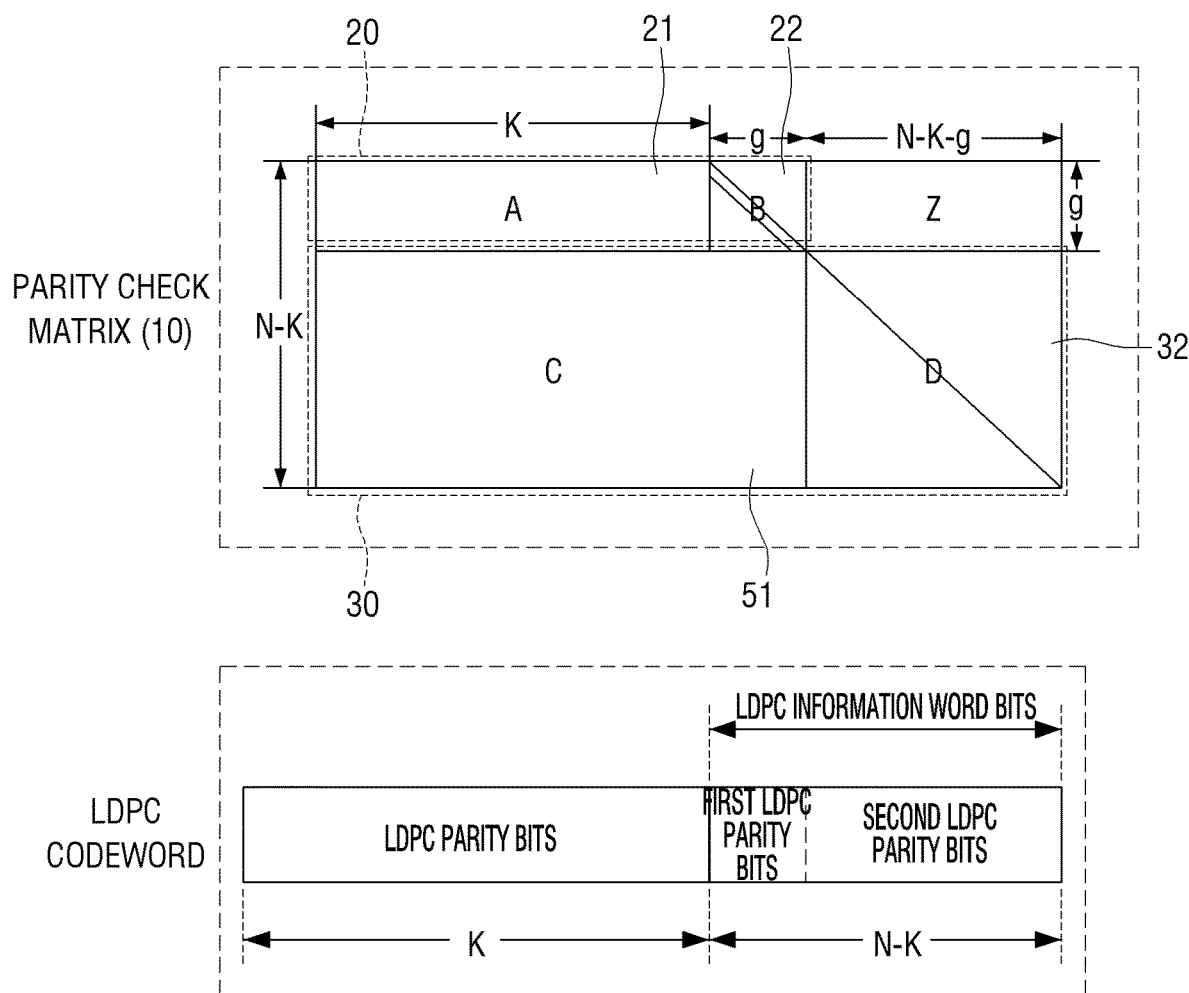
FIG. 5 is a diagram provided to describe a parity check matrix according to an exemplary embodiment.

FIG. 5 is a diagram provided to describe a parity check matrix according to an exemplary embodiment.

Referring to FIG. 5, a parity check matrix 10 may be a parity check matrix with the same structure as a parity check matrix defined by the Advanced Television Systems Committee (ATSC) 3.0 standard.

The parity check matrix 10 includes a first parity check matrix 20 and a second parity check matrix 30.

In this case, the first parity check matrix 20 includes a first information word sub-matrix 21 (that is, Matrix A) and a first parity sub-matrix 22 (that is, Matrix B). The second parity check matrix 30 includes a second information word sub-matrix 31 (that is, Matrix C) and a second parity sub-matrix 32 (that is, Matrix D).

Matrixes A and C are the matrixes corresponding to the LDPC information word bits. Matrix A may be formed of K number of columns and g number of rows. Matrix C may be formed of K+g number of columns and N−k−g number of rows.

In this case, K is the same as the number of the LDPC information word bits, and N is the same as the number of the LDPC codeword bits. Further, g is the same as the number of the parity bits corresponding to the first parity bits, that is, the first parity sub-matrix 22, and N−k−g is the same as the number of the parity bits corresponding to the second parity bits, that is, the second parity sub-matrix 32.

In Matrixes A and C, 1 is present at various positions. Hereinafter, the positions of 1 in Matrixes A and C will be described based on Table 1. Entries other than 1 in Matrixes A and C are 0.

For example, when a length (N) of an LDPC codeword is 16200, and a code rate is 4/15, indexes of a row where 1 is located in a 0_th column in an i_th column group of Matrixes A and C may be defined based on Table 1 below. In this case, a repetition interval of a column pattern in Matrixes A and C, that is, the number of columns which belong to a same column group may be 360.

TABLE 1

```
19 585 710 3241 3276 3648 6345 9224 9890 10841
181 494 894 2562 3201 4382 5130 5308 6493 10135
150 569 919 1427 2347 4475 7857 8904 9903
1005 1018 1025 2933 3280 3946 4049 4166 5209
420 554 778 6908 7959 8344 8462 10912 11099
231 506 859 4478 4957 7664 7731 7908 8980
179 537 979 3717 5092 6315 6883 9353 9935
147 205 830 3609 3720 4667 7441 10196 11809
60 1021 1061 1554 4918 5690 6184 7986 11296
145 719 768 2290 2919 7272 8561 9145 10233
388 590 852 1579 1698 1974 9747 10192 10255
231 343 485 1546 3155 4829 7710 10394 11336
4381 5398 5987 9123 10365 11018 11153
2381 5196 6613 6844 7357 8732 11082
1730 4599 5693 6318 7626 9231 10663
```

As parameters related to the parity check matrix 10, $M_1$, $M_2$, $Q_1$, and $Q_2$ may be present, and $M_1$, $M_2$, $Q_1$, and $Q_2$ may be defined variously depending upon the length and the code rate of an LDPC codeword. By way of example, when the length (N) of the LDPC codeword is 16200, and the code rate is 4/15, values of $M_1$, $M_2$, $Q_1$, and $Q_2$ may be $M_1=1080$, $M_2=10800$, $Q_1=3$, and $Q_2=30$.

$Q_1$ represents a size where columns in a same column group in Matrix A are cyclic shifted, and $Q_2$ represents a size where columns in a same column group in Matrix C are cyclic shifted.

Further, $Q_1=M_1/L$, $Q_2=M_2/L$, $M_1=g$, and $M_2=N-K-g$. L represents a repetition interval of a column pattern of each of Matrixes A and B. As an example, L may be 360.

Indexes of a row where 1 is located in Matrixes A and C may be determined based on a value of $M_1$.

In the above-described example, $M_1=1080$. In this regard, a position of a row where 1 is located in a 0_th column in an i_th column group of Matrix A may be determined based on values less than 1080 among the values of Table 1. A position of a row where 1 is located in a 0_th column in an i_th column group of Matrix C may be determined based on values greater than 1080 among the values of Table 1.

In Table 1, a sequence corresponding to a 0_th column group is "19 585 710 3241 3276 3648 6345 9224 9890 10841." Accordingly, in the 0_th column in the 0 th column group of Matrix A, 1 may be located at the 19_th row, the 585_th row, and the 710_th row. In the 0_th column in the 0_th column group of Matrix C, 1 may be located at the 3241_st row, the 3276_th row, the 3648_th row, the 6345_th row, the 9224_th row, the 9890_th row, and the 10841 st row.

In Matrix A, in response the position of 1 being defined in a 0_th column in each column group, the position may be cyclic shifted by an amount of $Q_1$ to define a position of a row where 1 is located in another column in each of the column groups. Further, in Matrix C, in response the position of 1 being defined in a 0_th column in each column group, the position may be cyclic shifted by an amount of $Q_2$ to define a position of a row where 1 is located in another column in each of the column groups.

In the above-described example, in the 0_th column in the 0_th column group in Matrix A, 1 is located at the 19_th row, the 585_th row, and the 710_th row. In this case, $Q_1=3$, and thus, indexes of a row where 1 is located in another column in the 0_th column group may be 22 (=19+3), 588 (=585+3), and 713 (=710+3). Further, indexes of a row where 1 is located in a 2_nd column in the 0_th column group may be 25 (=22+3), 591 (=588+3), and 716 (=713+3).

Meanwhile, in the 0_th column in the 0_th column group of Matrix C, 1 is located at the 3241 st row, the 3276_th row, the 3648_th row, the 6345_th row, the 9224_th row, the 9890_th row, and the 10841 st row. In this case, $Q_2=30$, and thus, indexes of a row where 1 is located in a 1 st column in the 0_th column group may be 3271 (=3241+30), 3306 (=3276+30), 3678 (=3648+30), 6375 (=6345+30), 9254 (=9224+30), 9920 (=9890+30), and 10871 (=10841+30). Further, the indexes of the row where 1 is located in the 2_nd column in the 0_th column group may be 3301(=3271+30), 3336(=3306+30), 3708(=3678+30), 6405(=6375+30), 9284 (=9254+30), 9950(=9920+30), and 10901(=10871+30).

According to the above method, the positions of the rows where 1 is located in the entire column groups of Matrixes A and C may be defined. However, the above method is only an example for illustrative purpose, and the positions in Matrixes A and C may be defined in various methods.

Table 1 is provided to describe an example of a sequence corresponding to each column group for showing the positions where 1 is located in each column group of Matrixes A and C. In other words, when the LDPC information word bits are encoded with the code rate in Table 1, the positions where 1 is located in Matrixes A and C may be defined based on different indexes from the indexes defined in Table 1 or based on different indexes according to the length of the LDPC codeword.

Matrixes B and D correspond to the first parity bits and the second parity bits, respectively. That is, the first parity bits may be generated based on Matrix B, and the second parity bits may be generated based on Matrix D.

Matrix B is a dual diagonal matrix formed of g number of columns and g number of rows. Accordingly, in Matrix B, a degree of the columns except for the last column is 2, and a degree of the last column is 1 (in this case, the degree represents the number of 1 value in a column).

Matrix D is a unit matrix (that is, identity matrix) formed of N-k-g number of columns and N-k-g of rows. Accordingly, in Matrix D, a degree of every column is 1.

Matrix Z is a zero matrix formed of N-k-g number of columns and g number of rows. Accordingly, the entire entries of Matrix Z is 0.

Accordingly, the parity check matrix 10 may be defined by Matrixes A, B, C, D, and Z described above.

Meanwhile, a parity check matrix used in the LDPC encoder of the first encoder 111, that is, a first LDPC encoder (not shown) may differ from a parity check matrix used in the LDPC encoder of the second encoder 121, that is, a second LDPC encoder (not shown).

The first LDPC encoder and the second LDPC encoder encode LDPC information word bits by using a parity check matrix in the structure of FIG. 5. In this case, the positions where 1 is located in the respective parity check matrixes may be different. Particularly, 1 may be located at different positions in Matrixes A and C of each parity check matrix.

As an example, when the first LDPC encoder and the second LDPC encoder encode the LDPC information word bits with a same code rate, the positions where 1 is located in Matrixes A and C of each parity check matrix used by the first LDPC encoder and the second LDPC encoder may be defined by different indexes.

As another example, when the first LDPC encoder and the second LDPC encoder generate different lengths of LDPC codewords, the parity check matrix used by the first LDPC encoder and the parity check matrix used by the second LDPC encoder have different sizes. Accordingly, the parity check matrixes used by the first LDPC encoder and the second LDPC encoder are different from each other.

The first LDPC encoder encodes the LDPC information word bits by using the parity check matrix in the structure of FIG. 5, but the second encoder may encode the LDPC information word bits by using the parity check matrix in a different structure.

For instance, the second encoder may use a parity check matrix in a structure defined by Digital Video Broadcasting the Second Generation Terrestrial (DVB-T2).

According to an exemplary embodiment, the receiver 1000 may receive a superposition-coded signal transmitted from the transmitter 100 and reconstruct data, that is, information word bits. This operation will be described below in further detail.

FIG. 6 is a block diagram illustrating a structure of a receiver according to an exemplary embodiment.

Referring to FIG. 6, the receiver 1000 may include a first decoder 200 (or first BICM decoder), an encoder 300 (or BICM encoder), and a second decoder 400 (or second BICM decoder).

The first decoder 200 generates bits corresponding to an upper layer signal by decoding a superposition-coded signal (that is, LDPC decoding). In other words, the first decoder 200 may LDPC decode the superposition-coded signal to reconstruct information word bits corresponding to the upper layer signal in the superposition-coded signal.

By way of example, the first decoder 200 may generate the information word bits transmitted through the upper layer signal by decoding the superposition-coded signal using an iterative decoding algorithm based on a sum-product algorithm.

The sum-product algorithm is a kind of a message passing algorithm. The message passing algorithm refers to an algorithm of exchanging messages through an edge, calculating an output message from the messages input in a variable node or a check node, and updating the message on a bipartite graph.

Hereinafter, a decoding method through a message passing operation will be described. The method will be described briefly since the method is commonly known to a person having ordinary skill in the art (hereinafter referred to as 'those skilled in the art').

Figure 7:
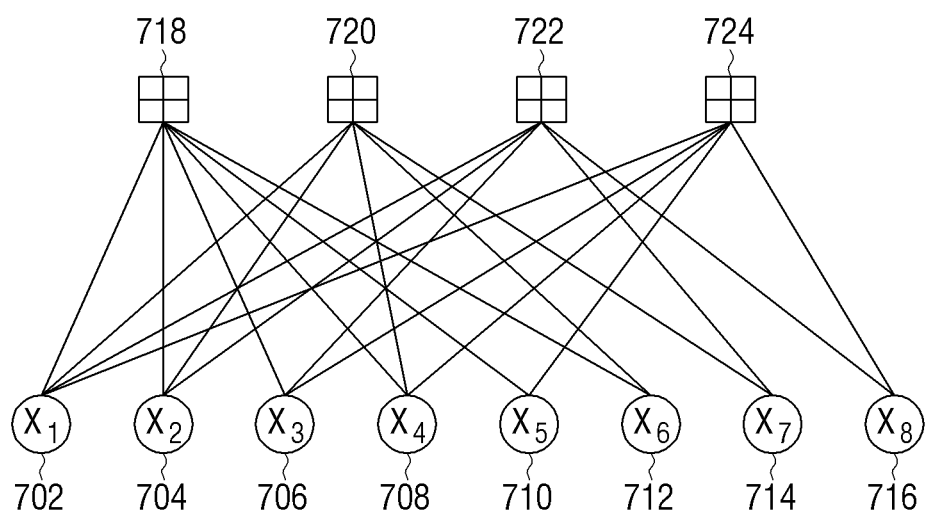
FIGS. 7, 8A and 8B are diagrams provided to describe LDPC decoding, according to exemplary embodiments.

FIG. 7 is a diagram provided to describe a method for illustrating an LDPC code as a graph, according to an exemplary embodiment.

FIG. 7 illustrates an example of a parity check matrix $H_1$ of an LDPC code formed of four (4) rows and eight (8) columns in a form of Tanner graph. Referring to FIG. 7, the parity check matrix $H_1$ has eight (8) columns, and thus, generates a codeword with a length of 8. The code generated by $H_1$ represents the LDPC code, and each column corresponds to an encoded bit.

Referring to FIG. 7, the Tanner graph of the LDPC code encoded and decoded based on the parity check matrix $H_1$ has eight variable nodes, namely, $x_1$(702), $x_2$(704), $x_3$(706), $x_4$(708), $x_5$(710), $x_6$(712), $x_7$(714), and $x_8$(716), and four check nodes, namely, 718, 720, 722, and 724. In this case, an i_th column and a j_th row of the parity check matrix $H_1$ of the LDPC code correspond to the variable node $x_i$ and a j_th check node, respectively. Further, a value of 1 at a point where the j_th column and the j_th row of the parity check matrix $H_1$ of the LDPC code intersect, that is, a value that is not 0, represents that there is an edge connecting the variable node $x_i$ and the j_th check node in the Tanner graph, as illustrated in FIG. 7.

In the Tanner graph of the LDPC code, the degrees of the variable nodes and the check nodes denote the number of edges connected to each node, and the degrees are the same as the number of entries which are not 0 in a column or in a row corresponding to the nodes in the parity check matrix of the LDPC code. For example, in FIG. 7, the degrees of the variable nodes, namely, $x_1$(702), $x_2$(704), $x_3$(706), $x_4$(708), $x_5$(710), $x_6$(712), $x_7$(714), and $x_8$(716) are 4, 3, 3, 3, 2, 2, 2, and 2, and the degrees of the check nodes, namely, 718, 720, 722, and 724 are 6, 5, 5, and 5, respectively. Further, in FIG. 7, the number of the entries which are not 0 in each column of the parity check matrix $H_1$ corresponding to the variable nodes of FIG. 7 is consistent with the above degrees 4, 3, 3, 3, 2, 2, 2, and 2 in a sequential order. Further, the number of the entries which are not 0 in each column of the parity check matrix $H_1$ corresponding to the check nodes of FIG. 7 is consistent with the above degrees 6, 5, 5, and 5 in a sequential order.

In this case, a value of an i_th bit may be determined based on a message of the i_th variable node. The value of the i_th bit may be determined by both of a soft decision and a hard decision. Accordingly, the performance of ci which is the i_th bit of the LDPC codeword corresponds to the performance of the i_th variable node of the Tanner graph and may be determined depending upon the position and the number of 1 in the i_th column of the parity check matrix. That is, the performance of the bits forming the LDPC codeword may depend upon the position and the number of 1 in the parity check matrix.

Figure 8A:
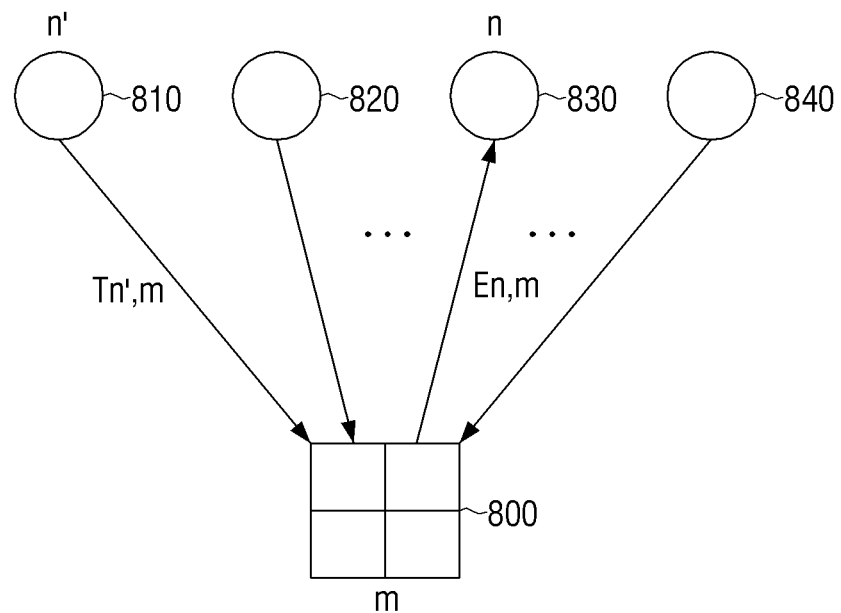
Figure 8B:
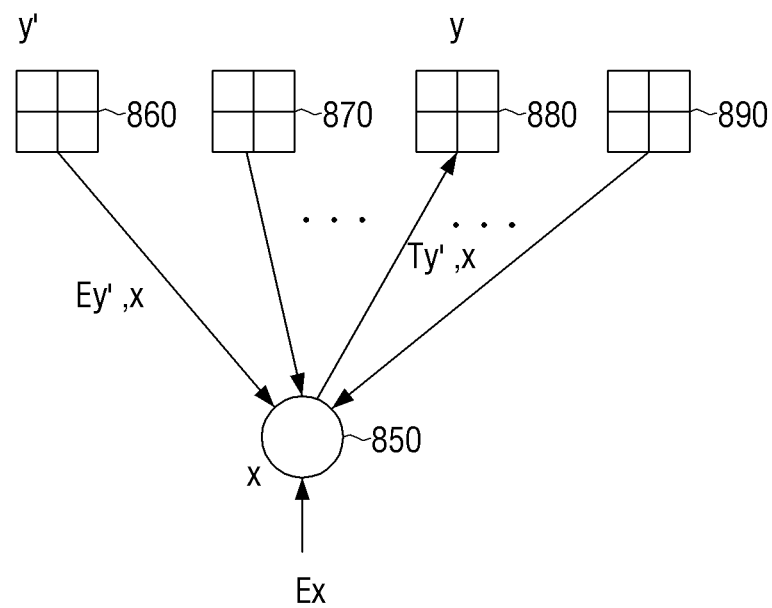

FIGS. 8A and 8B are diagrams provided to describe a message passing operation which is commonly used for LDPC decoding, that is, a message passing operation in a random check node and variable node.

Referring to FIG. 8A, a check node m 800 and a plurality of variable nodes 810, 820, 830, 840 connected to a check node m 800 are illustrated. In FIG. 8A, represents a message passed from a variable node n' 810 to the check node m 800, and $E_{n,m}$ represents a message passed from the check node m 800 to a variable node n 830. Herein, it is defined that a set of the entire variable nodes connected to the check node m 800 is N(m), and a set of the variable nodes of N(m) except for the variable node n 830 is N(m) \ n.

In this case, a message updating rule based on the sum-product algorithm may be expressed as Equation 1 below.

$$|E_{n,m}| = \Phi\left[\sum_{n' \in N(m)\setminus n} \Phi(|T_{n',m}|)\right] \quad \text{[Equation 1]}$$

$$\text{Sign}(E_{n,m}) = \prod_{n' \in N(m)\setminus n} \text{sign}(T_{n',m})$$

In Equation 1, $\text{Sign}(E_{n,m})$ represents a sign of Message $E_{n,m}$, and $|E_{n,m}|$ represents a magnitude of Message $E_{n,m}$. Further, Function $\Phi(x)$ may be expressed by Equation 2 below.

$$\Phi(x) = -\log\left(\tanh\left(\frac{x}{2}\right)\right) \quad \text{[Equation 2]}$$

Referring to FIG. 8B, a variable node x 850 and a plurality of check nodes 860, 870, 880, 890 connected to a variable node x 850 are illustrated. In FIG. 8B, $E_{y',x}$ represents a message passed from a check node y' 860 to the variable node x 850, $T_{y,x}$ represents a message passed from the variable node x 850 to a check node y 880. Herein, it is defined that a set of the entire variable nodes connected to the variable node x 850 is M(x), and a set of the variable nodes of M(x) except for the check node y 880 is M(x) \ y.

In this case, a message updating rule based on the sum-product algorithm may be expressed as Equation 3 below.

$$T_{y,x} = E_x + \sum_{y' \in M(x) \backslash y} E_{y',x} \qquad \text{[Equation 3]}$$

In Equation 3, $E_x$ represents an initial message value of the variable node x.

Further, a bit value of Node x may be determined as shown in Equation 4 below.

$$P_x = E_x + \sum_{y' \in M(x)} E_{y',x} \qquad \text{[Equation 4]}$$

In this case, an encoding bit corresponding to Node x may be determined according to $P_x$ value.

As described above, the first decoder 200 may reconstruct the information word bits transmitted through the upper layer signal in the superposition-coded signal through message passing between the variable nodes and the check nodes generated based on the parity check matrix, by the iterative decoding algorithm based on the sum-product algorithm.

In this case, the number of times of passing messages between the variable nodes and the check nodes of the parity check matrix, that is, the number of iterations may be preset in a system or the receiver 1000.

A parity check matrix used by the first decoder 200 may be the same as the parity check matrix used by the first LDPC encoder of the transmitter 100 for LDPC encoding. In other words, the parity check matrix may include the first information word sub-matrix, the first parity check matrix including the first parity sub-matrix which is the dual diagonal matrix, and the second parity check matrix including the second parity sub-matrix which is a unit matrix with respect to the second information word sub-matrix.

The first decoder 200 may generate (or reconstruct) some bits of the LDPC codeword corresponding to the upper layer signal from the superposition-coded signal by using a part of the parity check matrix.

In this case, some bits of the LDPC codeword include the LDPC information word bits and the first parity bits.

In other words, the first LDPC encoder of the transmitter 100 encodes the bits to be transmitted through the upper layer by using the parity check matrix. However, the first decoder 200 may generate some bits of the LDPC codeword from the superposition-coded signal by using a part of the parity check matrix used by the transmitter 100 for the LDPC decoding.

Figure 9:
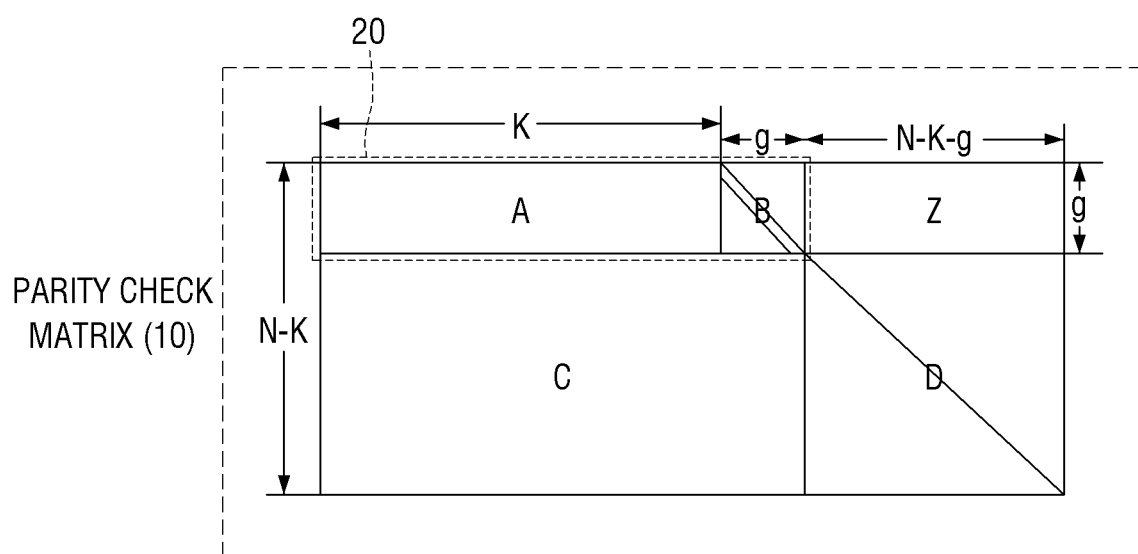
FIGS. 9 to 11 are diagrams provided to describe a parity check matrix used for LDPC decoding according to exemplary embodiments.

As illustrated in FIG. 9, the first decoder 200 may decode the superposition-coded signal by using the first parity check matrix 20, that is, without using the second parity check matrix 30 (FIG. 5).

That is, the first decoder 200 may decode the superposition-coded signal by using the first parity check matrix 20 between the first and second parity check matrixes of the parity check matrix 10, and reconstruct the LDPC information word bits and the first parity bits transmitted through the upper layer.

Figure 10:
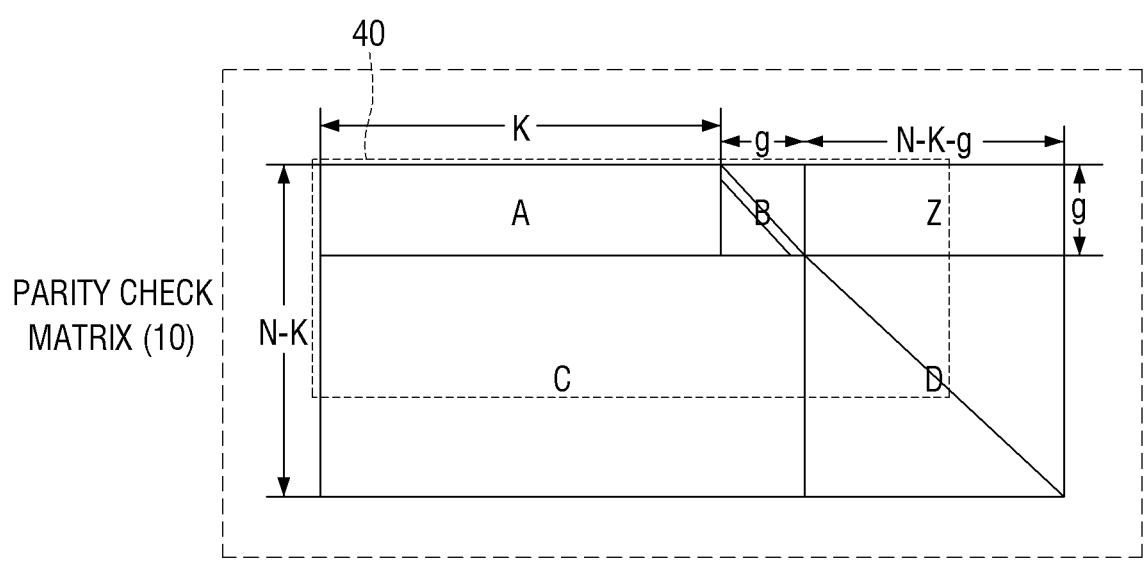

According to an exemplary embodiment, as illustrated in FIG. 10, the first decoder 200 may decode the superposition-coded signal by using the entire first parity check matrix and a part of the second parity check matrix. At this time, a part of the zero matrix (Matrix Z) may be used.

That is, the first decoder 200 may decode the superposition-coded signal by using a matrix 40 including the entire first parity check matrix and a part of the second parity check matrix of the parity check matrix 10, and reconstruct the LDPC information word bits and the first parity bits transmitted through the upper layer.

According to an exemplary embodiment, the first decoder 200 may decode the superposition-coded signal by using the entire first parity check matrix and at least one sub-matrix among a plurality of sub-matrixes of the second parity check matrix.

In this case, each of the plurality of sub-matrixes of the second parity check matrix may include a part of each of the second information word sub-matrix and the second parity sub-matrix.

Figure 11:
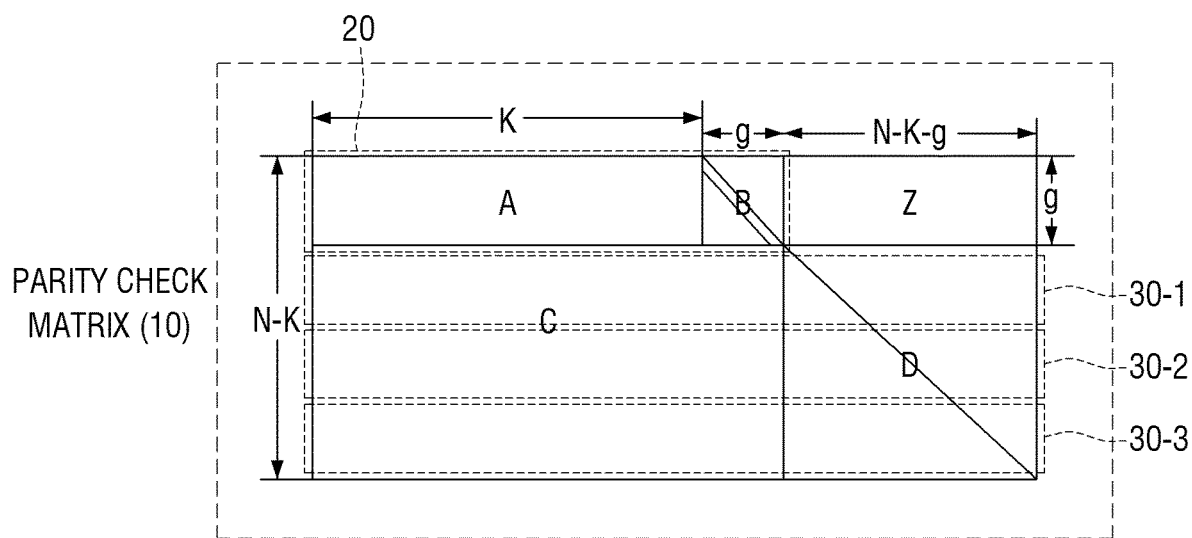

By way of example, it is assumed that the second parity check matrix is divided into three sub matrixes 30-1, 30-2, 30-3 as illustrated in FIG. 11.

The first decoder 200 may use the first parity check matrix 20 and the first sub-matrix 30-1 of the second parity check matrix at a first iteration, use the first parity check matrix 20 and the second sub-matrix 30-2 of the second parity check matrix at a second iteration, and use the first parity check matrix 20 and the third sub-matrix 30-3 of the second parity check matrix at a third iteration during the decoding operation.

That is, the first decoder 200 may decode the superposition-coded signal by using different sub-matrixes of the second parity check matrix along with the first parity check matrix 20 to reconstruct the LDPC information word bits and the first parity bits transmitted through the upper layer signal.

During the decoding operation, the first decoder 200 may decode the superposition-coded signal by using a part of the parity check matrix based on the number of times the messages are passed between the variable nodes and the check nodes of the parity check matrix, that is, the number of iterations.

To be specific, during the decoding operation, the first decoder 200 may decode the superposition-coded signal by using the entire parity check matrix or a part of the parity check matrix before the number of iteration exceeds a predetermined number. In response to the number of iteration exceeding the predetermined number, the first decoder 200 may decode the superposition-coded signal by using the first parity check matrix to reconstruct the LDPC information word bits and the first parity bits transmitted through the upper layer.

The number of iterations used as a reference for a time point when the parity check matrix used during the decoding operation is changed may be preset in the system or the receiver 1000.

As described above, according to various exemplary embodiments, the decoding is performed by using a part of the parity check matrix, thereby reducing the decoding complexity.

In order to reconstruct the base layer signal from the superposition-coded signal, it is necessary to reconstruct the upper layer signal from the superposition-coded signal, and then, cancel the upper layer signal from the superposition-coded signal.

In the superposition coding, in general, the base layer operates at a Signal-to-Noise Ratio (SNR) which is sufficiently high as compared with the upper layer, and the LDPC code applied to the upper layer may operate at a low SNR. Accordingly, the bits transmitted through the upper layer signal may be reconstructed with low error probability although the entire parity check matrix is not used to decode the upper layer signal.

Accordingly, in the exemplary embodiments disclosed herein, a part of the parity check matrix, not the entire parity check matrix, is used at all of the decoding iterations, or different parts of the parity check matrix are additionally used depending upon the iteration, thereby reducing the decoding complexity.

Meanwhile, in response to the LDPC information word bits and the first parity bits corresponding to the upper layer signal being reconstructed from the superposition-coded signal, the first decoder 200 may determine whether an error is present in the bits.

The LDPC encoding operation is a process of generating an LDPC codeword that satisfies $H \cdot C^T = 0$. Accordingly, in response to the product of the decoded bits, that is, the bits reconstructed through the decoding and the parity check matrix being '0' vector, it may be determined that there is no error in the bits reconstructed through the decoding.

Accordingly, the first decoder 200 may multiply the bits reconstructed through the decoding by the parity check matrix, and determine whether the product is '0' vector to determine whether an error is present in the bits reconstructed through the decoding.

Meanwhile, $H \cdot C^T = 0$ is based on equations where a sum of values obtained by multiplying each column of the parity check matrix by the LDPC codeword bits becomes '0'. In this case, each of the equations is called a 'parity check equation', and a value of the left side of the parity check equation is called an 'LDPC syndrome value (or syndrome parity check value).'

Accordingly, an operation of multiplying the bits reconstructed through the decoding by the parity check matrix and determining whether the values become '0' in order to determine whether an error is present in the bits reconstructed through the decoding is an operation of determining whether the LDPC syndrome value is '0'. Accordingly, the first decoder 200 may determine whether the LDPC syndrome value satisfies a predetermined value '0', and determine whether an error is present in the bits reconstructed through the decoding. In this case, the first decoder 200 may determine whether the LDPC syndrome value with respect to the first parity check matrix satisfies '0'.

To be specific, the first decoder 200 may multiply the LDPC information word bits and the first parity bits reconstructed through the decoding by a part of the parity check matrix, that is, the first parity check matrix and determine whether the product satisfies '0'.

In response to no error being present in the reconstructed bits, the first decoder 200 may output the reconstructed bits to the encoder 300.

In response to an error being present in the reconstructed bits, the first decoder 200 may repeat the decoding operation a predetermined number of times or remove the reconstructed bits.

The LDPC information word bits reconstructed through the LDPC decoding include the information word bits and the BCH parity bits.

In response to an error being present in the bits reconstructed through the LDPC decoding, the first decoder 200 may perform BCH decoding to determine whether an error is present in the LDPC information word bits and correct bits where the error occurred. That is, in response to determining that the LDPC syndrome value does not satisfy the predetermined value, that is, the LDPC syndrome value is not '0', the first decoder 200 may decode (that is, BCH decoding) the LDPC information word bits. To be specific, the first decoder 200 may BCH decode the LDPC information word bits reconstructed through the LDPC decoding and determine whether an error is present in the LDPC information word bits, and the error is recovered by the BCH decoding.

In response to no error being present in the LDPC information word bits or the error being recovered by the BCH decoding, the first decoder 200 may output the LDPC information word bits to the encoder 300. In response to failing to recover the error by the BCH decoding, the first decoder 200 may remove the bits reconstructed through the decoding.

The encoder 300 may generate parity bits through LDPC encoding. In this case, the encoder 300 may perform the LDPC encoding based on a parity check matrix which is the same as the parity check matrix used by the first LDPC encoder of the transmitter 100 for the LDPC encoding.

In response to no error being present in the LDPC information word bits or the first parity bits reconstructed through decoding, the first decoder 200 outputs the LDPC information word bit and the first parity bits to the encoder 300. That is, in response to determining that the LDPC syndrome value satisfies the predetermined value (that is, '0') according to a syndrome check result of the LDPC codeword based on the first parity check matrix, the first decoder 200 outputs the LDPC information word bit and the first parity bits to the encoder 300. In this case, the encoder 300 may encode the LDPC information word bits and the first parity bits by using the parity check matrix and generate the second parity bits. To be specific, the encoder 300 may encode the LDPC information word bits and the first parity bits by using the second parity check matrix between the first and second parity check matrixes of the parity check matrix, and generate the second parity bits corresponding to the second parity sub-matrix.

However, as described above, in response to an error being present in the bits reconstructed through the decoding, the first decoder 200 may perform the BCH decoding in order to determine whether an error is present in the LDPC information word bits. In response to no error being present in the LDPC information word bits or the error being recovered by the BCH decoding, the first decoder 200 may output the LDPC information word bits to the encoder 300. In this case, the encoder 300 may encode the LDPC information word bits by using the parity check matrix, and generate the first parity bits corresponding to the first parity check matrix and the second parity bits corresponding to the second parity sub-matrix.

The LDPC information word bit, the first parity bits, and the second parity bits obtained by the above operations are the bits corresponding to the upper layer signal and may be the bits that the transmitter 100 intended to transmit through the upper layer.

Accordingly, the receiver 1000 may remove and process the upper layer signal generated based on the bits from the superposition-coded signal, and reconstruct the bits transmitted through the base layer signal.

To be specific, the second decoder 400 may generate (or reconstruct) the bits transmitted through the base layer signal from a signal which is generate by removing the upper layer signal, corresponding to the LDPC information word bits, the first parity bits, and the second parity bits, from the superposition-coded signal.

In this case, the second decoder 400 may generate the bits of the base layer signal by using the parity check matrix which is the same as the parity check matrix used by the second LDPC encoder of the transmitter 100 for the LDPC encoding.

Accordingly, the receiver 1000 may receive the bits transmitted through the upper layer and the base layer.

Figure 12:
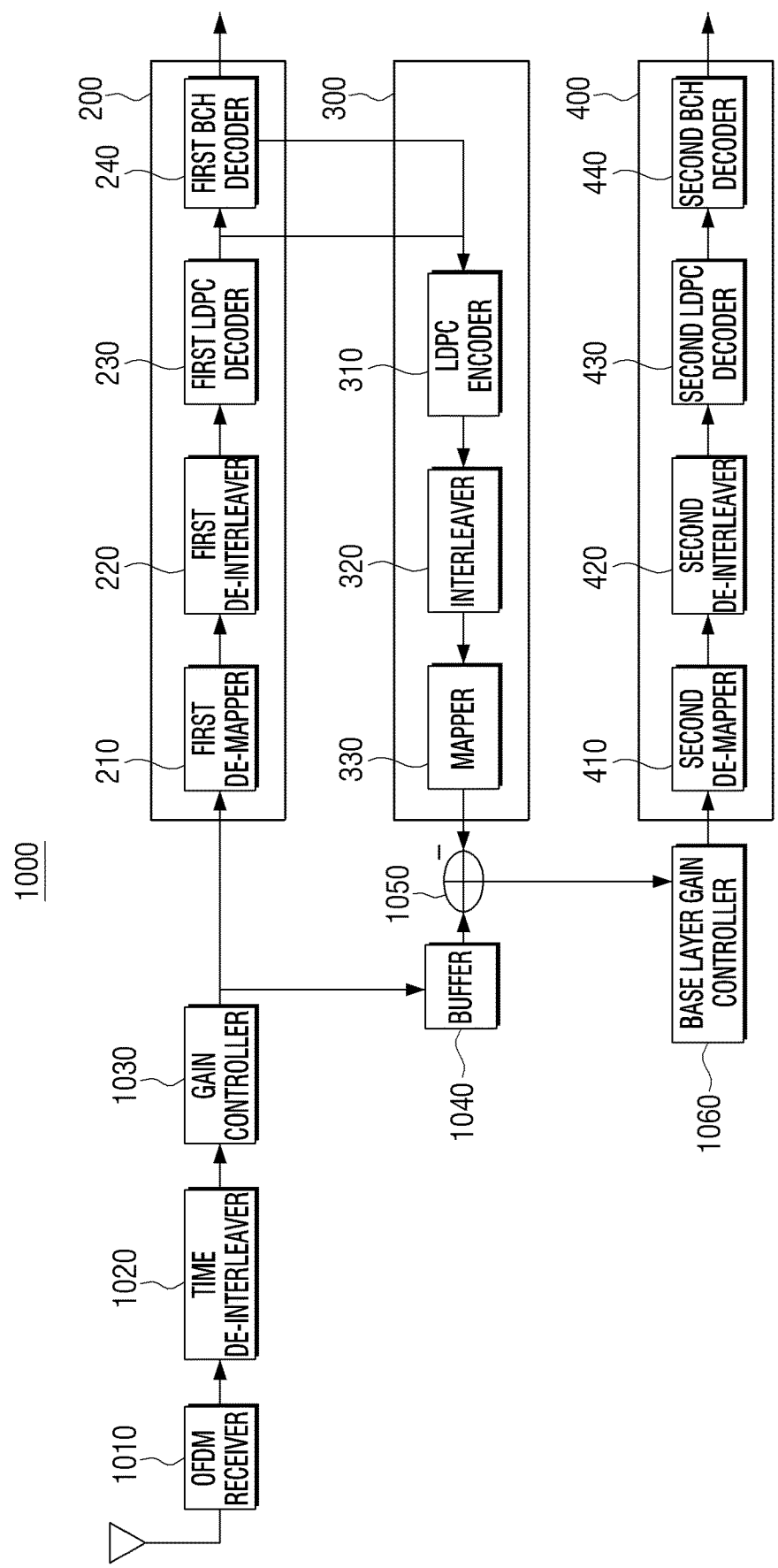
FIG. 12 is a block diagram illustrating a detailed structure of a receiver according to an exemplary embodiment.

FIG. 12 is a block diagram illustrating a detailed structure of a receiver according to an exemplary embodiment.

Referring to FIG. 12, a receiver 1000 may include an OFDM receiver 1010, a time de-interleaver 1020, a gain controller 1030, a buffer 1040, a signal remover 1050, a base layer gain controller 1060, a first decoder 200, an encoder 300, and a second decoder 400. The detailed descriptions on the first decoder 200, the encoder 300, and the second decoder 400 have been provided above, and thus, a repeated description will be omitted.

The OFDM receiver 1010 may perform OFDM demodulation with respect to the superposition-coded signal transmitted from the transmitter 100, generates cells from an OFDM frame, and output the cells to the time de-interleaver 1020.

The time de-interleaver 1020 de-interleaves the output of the OFDM receiver 1010. The time de-interleaver 1020 corresponds to the time interleaver 150 of the transmitter 100. The time de-interleaver 1020 may deinterleave the cells and output the deinterleaved cells to the gain controller 1030.

The gain controller 1030 adjusts a gain with respect to the output of the time de-interleaver 1020. The gain controller 1030 corresponds to the gain controller 140 of the transmitter 100. The gain controller 1030 adjusts the gain with respect to the signal outputted from the time de-interleaver 1020, and outputs the gain-adjusted signal to the first decoder 200 and the buffer 1040.

The first decoder 200 may process the signal output from the gain controller 1030, and decode the bits transmitted through the upper layer signal. For doing this, the first decoder 200 may include a first de-mapper 210 (or first constellation de-mapper), a first de-interleaver 220, a first LDPC decoder 230, and a first BCH decoder 240.

The first de-mapper 210 corresponds to the first mapper 113 of the transmitter 100. The first de-mapper 210 may demodulate the signal output from the gain controller 1030, and generate values corresponding to the bits transmitted through the upper layer signal.

The values corresponding to the bits transmitted from the transmitter 100 are values which are calculated commonly based on a probability that the received bit is 0 and a probability that the received bit is 1. In this case, each probability may be used as a value corresponding to the bits or may be a Likelihood Ratio (LR) value or a Log Likelihood Ratio (LLR).

The LR value represents a ratio between the probability that the bits transmitted from the transmitter 100 is 0 and the probability that the bits transmitted from the transmitter 100 is 1, and the LLR value may be expressed as a value obtained by applying Log to the ratio between the probability that the bits transmitted from the transmitter 100 is 0 and the probability that the bits transmitted from the transmitter 100 is 1.

In the above-described example, the LR value or the LLR value is used, but this is only an example for illustrative purpose, and the received signal itself may be used.

In this case, the first de-mapper 210 may demodulate the superposition-coded signal based on a modulation method applied to the upper layer signal.

For example, when the transmitter 100 modulated a signal corresponding to the upper layer according to a QPSK method, the first de-mapper 210 may demodulate the superposition-coded signal based on the QSPK method.

The first de-interleaver 220 de-interleaves the output of the first de-mapper 210. The first de-interleaver 220 corresponds to the first interleaver 112 of the transmitter 100. The first de-interleaver 220 may perform the interleaving operation performed by the first interleaver 112 reversely, de-interleave values corresponding to the bits, and output the values to the first LDPC decoder 230.

The first LDPC decoder 230 performs LDPC decoding by using the values output from the first de-interleaver 220. The first LDPC decoder 230 corresponds to the LDPC encoder of the first BICM encoder 110 of the transmitter 100. The first LDPC decoder 230 may decode the de-interleaved values. In this case, the first LDPC decoder 230 may perform the decoding by using a part of the parity check matrix to reconstruct the LDPC information word bits and the first parity bits. In this case, the parity check matrix may be the same as the parity check matrix used by the first LDPC encoder of the transmitter 100 for the LDPC encoding, and the first LDPC decoder 230 may perform the decoding by using a part of the parity check matrix. The method for performing a decoding operation by using a part of a parity check matrix was described above.

In response to no error being present in the bits reconstructed through the decoding, the first LDPC decoder 230 may output the bits reconstructed through the decoding to the LDPC encoder 310.

The first BCH decoder 240 BCH decodes the bits decoded by the first LDPC decoder 230 and outputs the bits transmitted through the upper layer signal. The first BCH decoder 240 corresponds to the BCH encoder of the first BICM encoder 110 of the transmitter 100. The first BCH decoder 240 may determine whether an error is present in the LDPC information word bits by BCH decoding the LDPC information word bits reconstructed through the LDPC decoding. In response to an error being present in the LDPC information word bits, the first BCH decoder 240 may correct the error.

Accordingly, the first BCH decoder 240 may receive the information word bit transmitted through the upper layer signal (in this case, the information word bits is data and belongs to Stream A of FIG. 1).

In response to no error being present in the LDPC information word bits or the error being recovered, the first BCH decoder 240 may output the LDPC information word bits to the LDPC encoder 310.

The LDPC encoder 310 LDPC encodes the bits output from the first decoder 200. In this case, the LDPC encoder 310 may LDPC encode the bits based on a parity check matrix which is the same as the parity check matrix used by the first LDPC-encoder of the transmitter 100 for the LDPC encoding. To be specific, the LDPC encoder 310 may encode the LDPC information word bits and the first parity bits output from the first LDPC decoder 230 by using the second parity check matrix between the first and second parity check matrixes of the parity check matrix or encode the LDPC information word bits output from the first BCH decoder 240 by using the parity check matrix to generate the bits corresponding to the upper layer signal.

The interleaver 320 interleaves the bits output from the LDPC encoder 310. The interleaver 320 corresponds to the first interleaver 112 of the transmitter 100. The interleaver 320 interleaves the bits output from the LDPC encoder 310 in the same manner as the first interleaver 112, and outputs the interleaved bits to the mapper 330.

The mapper 330 modulates the bits output from the interleaver 320. The mapper 330 corresponds to the first mapper 113 of the transmitter 100. The mapper 330 may map the bits output from the interleaver 320 onto constellation points in the same manner as the first mapper 113. For example, when the first mapper 113 performed the modulation according to the QPSK method, the mapper 330 may modulate the bits output from the interleaver 320 according to the QPSK method.

The buffer 1040 stores the signal output from the gain controller 1030.

The signal remover 1050 receives the signal stored in the buffer 1040 and the signal output from the encoder 300, removes the signal output from the encoder 300 from the signal received from the buffer 1040, that is, the superposition-coded signal, and outputs a resultant signal to the base layer gain controller 1060. That is, the signal remover 1050 removes the upper layer signal corresponding to the LDPC information word bits, the first parity bits, and the second parity bits from the superposition-coded signal and generates a signal corresponding to the base layer.

The base layer gain controller 1060 corresponds to the base layer gain controller 130 of the transmitter 100. The base layer gain controller 1060 adjusts the gain with respect to the signal output from the signal remover 1050 and outputs the gain-adjusted signal to the second decoder 400.

The second decoder 400 may process the signal output from the base layer gain controller 1060 and reconstruct the bits transmitted through the base layer. For doing this, the second decoder 400 may include a second de-mapper 410 (or second constellation de-mapper), a second de-interleaver 420, a second LDPC decoder 430, and a second BCH decoder 440.

The second de-mapper 410 corresponds to the second mapper 123 of the transmitter 100. The second de-mapper 410 may demodulate the signal output from the base layer gain controller 1060 and generate values corresponding to the bits transmitted through the base layer signal.

The values corresponding to the bits transmitted from the transmitter 100 are values which are calculated commonly based on a probability that the received bit is 0 and a probability that the received bit is 1. In this case, each probability may be used as a value corresponding to the bits or may be the LR value or the LLR.

The LR value represents a ratio between the probability that the bit transmitted from the transmitter 100 is 0 and the probability that the bit transmitted from the transmitter 100 is 1, and the LLR value may be expressed as a value obtained by applying Log to the ratio between the probability that the bit transmitted from the transmitter 100 is 0 and the probability that the bit transmitted from the transmitter 100 is 1.

In the above-described example, the LR value or the LLR value is used, but this is only an example for illustrative purpose, and the received signal itself may be used.

The second de-mapper 210 may demodulate the signal in which the upper layer signal was removed from the superposition-coded signal based on the modulation method applied to the base layer signal. As an example, when the transmitter 100 modulated the signal corresponding to the base layer according to a 64-QAM method, the second de-mapper 410 may perform the de-modulation based on the 64-QAM. As another example, when the transmitter 100 modulated the signal corresponding to the base layer according to a 256-QAM, the second de-mapper 410 may perform the de-modulation based on the 256-QAM method.

The second de-interleaver 420 de-interleaves the output of the second de-mapper 410. The second de-interleaver 420 corresponds to the second interleaver 122 of the transmitter 100. The second de-interleaver 420 may perform the interleaving operation performed by the second interleaver 122 reversely, de-interleave values corresponding to the bits, and output the values to the second LDPC decoder 430.

The second LDPC decoder 430 performs LDPC decoding by using the values output from the second de-interleaver 420. The second LDPC decoder 430 corresponds to the LDPC encoder of the second BICM encoder 120 of the transmitter 100. The second LDPC decoder 430 may decode the de-interleaved values. In this case, the second LDPC decoder 430 may perform LDPC decoding by using a parity check matrix. The parity check matrix may be a parity check matrix which is the same as the parity check matrix used by the second LDPC encoder of the transmitter 100 for LDPC encoding.

The second BCH decoder 440 BCH decodes the bits decoded by the second LDPC decoder 430 and outputs the bits transmitted through the base layer signal. The second BCH decoder 440 corresponds to the BCH encoder of the transmitter 100. The second BCH decoder 440 may determine whether an error is present in the LDPC information word bits reconstructed through LDPC decoding. In response to an error being present, the second BCH decoder 440 may correct the error. Accordingly, the second BCH decoder 440 may receive the information word bits transmitted through the base layer signal (in this case, the information word bits is data and belongs to Stream B of FIG. 1).

Figure 13:
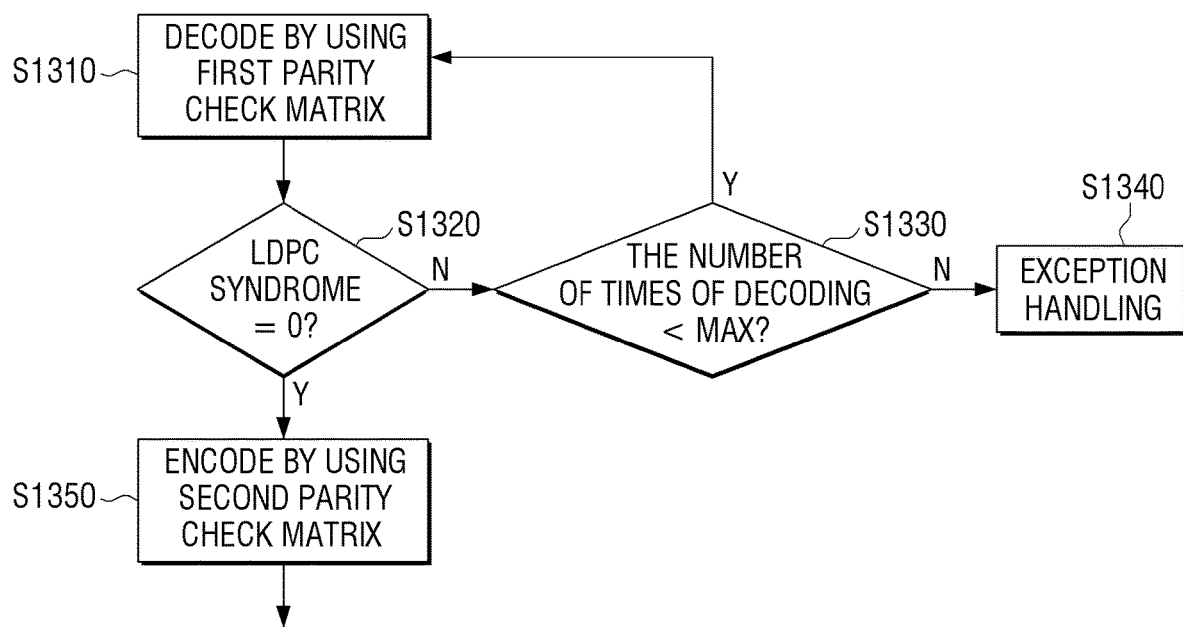
FIGS. 13 to 15 are flowcharts provided to describe a method for processing a signal according to exemplary embodiments.
Figure 14:
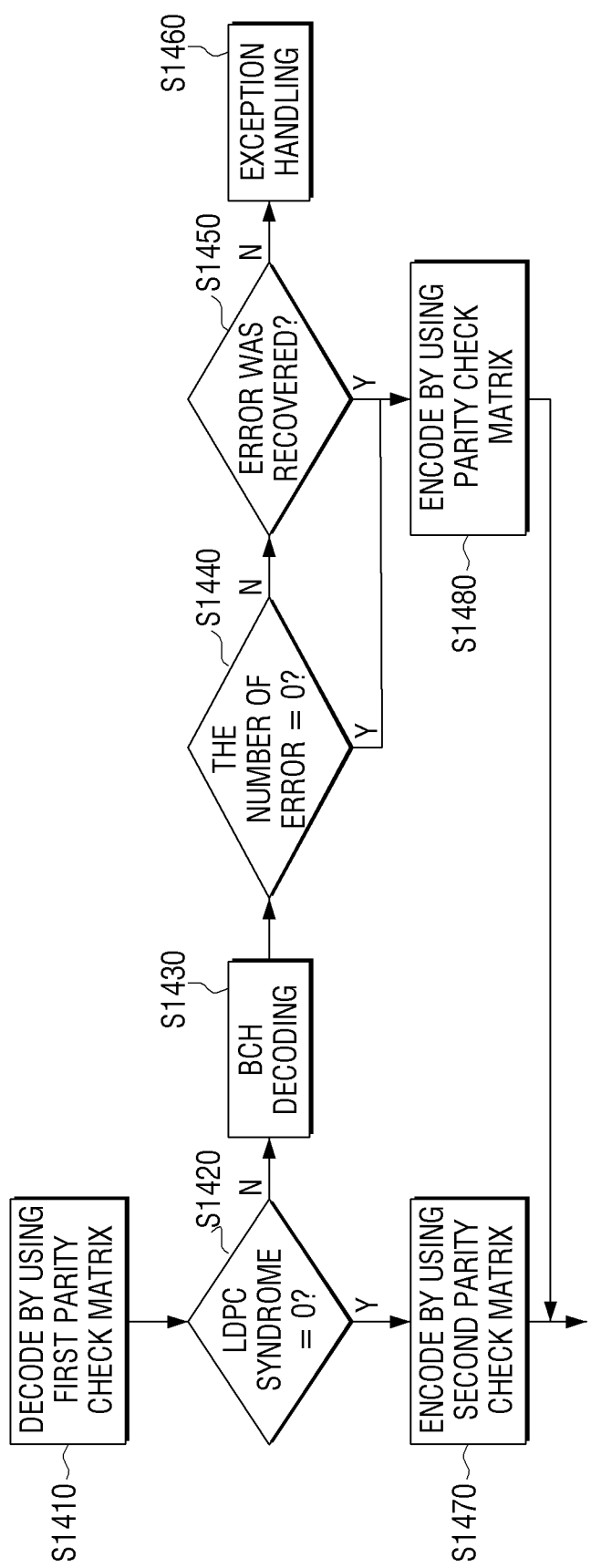

FIGS. 13 and 14 are flowcharts provided to describe a method for processing a signal according to exemplary embodiments.

As illustrated in FIG. 13, a first decoder 200 performs decoding bits received from the transmitter 100 (FIG. 1) by using a part of a parity check matrix (S1310).

Subsequently, the first decoder 200 determines whether an error is present in the decoded bits through the LDPC syndrome check (S1320). In this case, the first decoder 200 may use a first parity check matrix included in the parity check matrix.

In response to an error being present in the decoded bits (S1320-N), the first decoder 200 determines whether the number of times that decoding has been performed with respect to the received bits is less than a predetermined number (S1330). In response to determining that the number of the decoding times is less than the predetermined number (S1330-Y), the first decoder 200 repeats the decoding (S1310).

In response to determining that the number of the decoding times is greater than the predetermined number, the first decoder 200 removes the decoded bits through exception handling (S1340).

In response to determining that no error is present in the decoded bits (S1320-Y), the encoder 300 may encode the decoded bits including LDPC information word bits and first parity bits based on a second parity check matrix, and generate second parity bits corresponding to the second parity check matrix (S1350).

Subsequently, a receiver 1000 may generate an upper layer signal based on the LDPC information word bits, the first parity bits, and the second parity bits, remove the upper layer signal from a superposition-coded signal, and reconstruct the bits transmitted through a base layer signal.

As illustrated in FIG. 14, the first decoder 200 performs the decoding by using a part of the parity check matrix (S1410).

Subsequently, the first decoder 200 determines whether an error is present in the decoded bits through the LDPC syndrome check (S1420). In this case, the first decoder 200 may use the first parity check matrix.

In response to no error being present in decoded bits (S1420-Y), the encoder 300 may encode the LDPC information word bits and the first parity bits may based on the second parity check matrix, and generate the second parity bits corresponding to the second parity check matrix (S1470).

Subsequently, the receiver 1000 may generate the upper layer signal based on the LDPC information word bits, the first parity bits, and the second parity bits, remove the upper layer signal from the superposition-coded signal, and reconstruct the bits transmitted through the base layer signal.

In response to an error being present in decoded bits (S1420-N), the first decoder 200 performs BCH decoding with respect to the LDPC information word bits (S1430).

After the BCH decoding, the first decoder 200 determines whether an error is present in the LDPC information word bits (S1440). In response to an error being present, the first decoder 200 determines whether the error is corrected through the BCH decoding (S1450).

In response to determining that the error is not corrected through the BCH decoding, the first decoder 200 removes the decoded bits through exception handling (S1460).

In response to determining that no error is present (S1440-Y) or the error is corrected (S1450-Y), the encoder 300 may encode the LDPC information word bits based on the parity check matrix and generate the parity bits (S1480).

To be specific, the encoder 300 may encode the LDPC information word bits by using the parity check matrix and generate the first parity bits and the second parity bits.

Subsequently, the receiver 1000 may generate the upper layer signal based on the LDPC information word bits, the first parity bits, and the second parity bits, remove the upper layer signal from the superposition-coded signal, and reconstruct the bits transmitted through the base layer signal.

Figure 15:
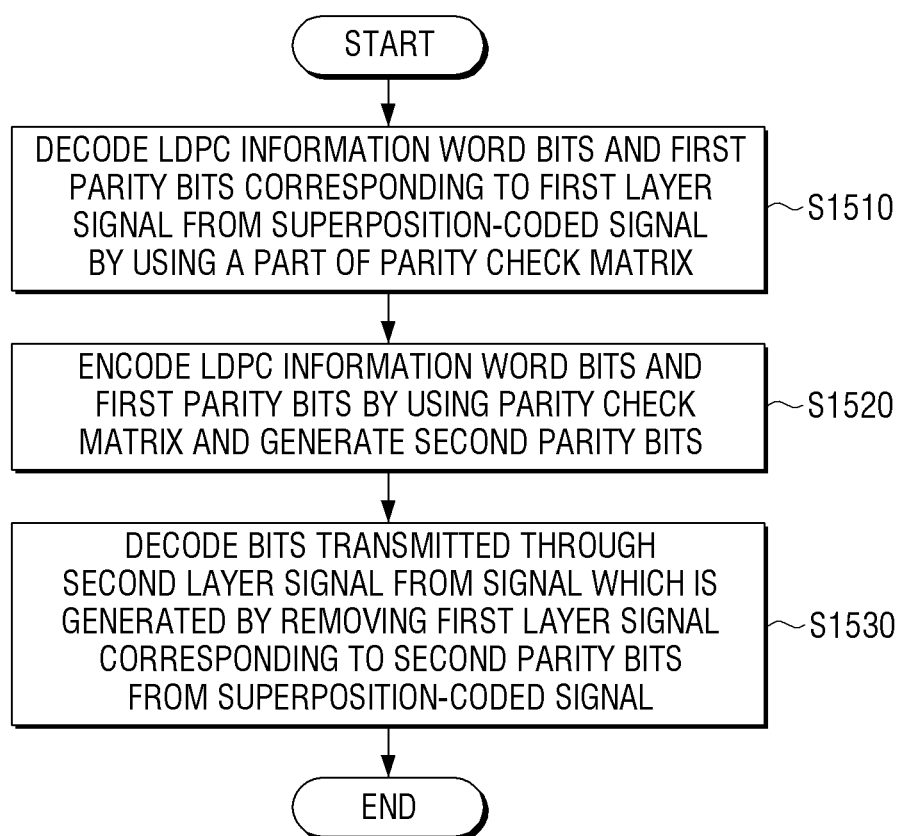

FIG. 15 is a flowchart provided to describe a method for processing a signal according to exemplary embodiment.

LDPC information word bits and first parity bits corresponding to a first layer signal are reconstructed by decoding a superposition-coded signal using a part of a parity check matrix (S1510).

Subsequently, the LDPC information word bits and the first parity bits are encoded by using the parity check matrix to generate second parity bits (S1520).

Then, bits transmitted through a second layer signal are reconstructed by decoding a signal which is generated by removing the first layer signal, corresponding to the LDPC information word bits, the first parity bits and the second parity bits, from the superposition-coded signal (S1530).

In this case, the parity check matrix may include a first parity check matrix including a first parity sub-matrix that is a dual diagonal matrix with respect to a first information word sub-matrix and a second parity check matrix including a second parity sub-matrix that is a unit matrix with respect to a second information word sub-matrix.

The first parity bits may correspond to the first parity sub-matrix, and the second parity bits may correspond to the second parity sub-matrix.

In operation S1510, the superposition-coded signal may be decoded by using the first parity check matrix.

In operation S1510, the superposition-coded signal may be decoded by using the entire first parity check matrix and a part of the second parity check matrix.

In operation S1510, the superposition-coded signal may be decoded by using the entire parity check matrix or a part of the parity check matrix before the number of times of iteration exceeds a predetermined number, and in response to the number of times of iteration exceeding the predetermined number, the superposition-coded signal may be decoded by using the first parity check matrix.

In operation S1510, the superposition-coded signal may be decoded by using the entire first parity check matrix and at least one sub-matrix among a plurality of sub-matrixes of the second parity check matrix. In this case, each of the plurality of sub-matrixes may include a part of each of the second information word sub-matrix and the second parity sub-matrix.

In operation S1520, the LDPC information word bits and the first parity bits may be encoded by using the second parity check matrix to generate the second parity bits corresponding to the second parity sub-matrix.

To be specific, in response to determining that an LDPC syndrome value satisfies a predetermined value according to a syndrome check result with respect to the LDPC information word bits and the first parity bits based on the first parity check matrix, the LDPC information word bits and the first parity bits may be encoded by using the second parity check matrix to generate the second parity bits corresponding to the second parity sub-matrix.

In operation S1510, in response to determining that the LDPC syndrome value does not satisfy the predetermined value, the LDPC information word bits may be decoded to determine whether an error is present in the LDPC information word bits and correct the error if the error is present. Subsequently, the LDPC information word bits may be encoded by using the parity check matrix to generate the first parity bits corresponding to the first parity sub-matrix and the second parity bits corresponding to the second parity sub-matrix.

The parity check matrix may differ from the parity check matrix used to decode the bits transmitted through the second layer signal.

Meanwhile, a non-transitory computer readable medium including a program for sequentially executing the operations of the method for processing a signal as described above may be provided. The non-transitory computer readable medium refers to a medium that stores data permanently or semi-permanently unlike a register, a cache, or a memory that stores data for a short time, and is readable by an apparatus. Particularly, the above-described various applications and programs may be stored in and provided through the non-transitory computer readable medium, such as, a Compact Disc (CD), a Digital Versatile Disk (DVD), a hard disk, a Blu-ray disk, a Universal Serial Bus (USB), a memory card, a Read-Only Memory (ROM), or the like.

At least one of the components, elements, modules or units represented by a block as illustrated in FIGS. 1, 6 and 12 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

As above, a few exemplary embodiments have been shown and described. The foregoing exemplary embodiments and advantages are merely exemplary and are not to be construed as limiting the present inventive concept. The present teaching can be readily applied to other types of devices. Also, the descriptions of the exemplary embodiments are intended to be illustrative, and not to limit the scope of the claims, and many alternatives, modifications, and variations will be apparent to those skilled in the art.

What is claimed is:

1. A receiver for receiving a superposition-coded signal, the receiver comprising:
    a first decoder configured to decode data of the superposition-coded signal to generate information bits corresponding to a first layer signal of the superposition-coded signal based on at least a part of a parity check matrix of a low density parity check (LDPC) code;
    an encoder configured to encode the information bits and first parity bits to generate second parity bits based on at least the part of the parity check matrix;
    an interleaver configured to interleave bits of a codeword comprising the information bits, the first parity bits and the second parity bits;
    a mapper configured to map the interleaved bits of the codeword to constellation points; and
    a second decoder configured to decode data of a second layer signal to generate bits corresponding to the second layer signal,
    wherein the second layer signal is obtained by removing a signal which is generated based on the constellation points, from the superposition-coded signal, and
    wherein the parity check matrix comprises a dual diagonal matrix corresponding to the first parity bits and an identity matrix corresponding to the second parity bits.

2. The receiver of claim 1, wherein the first decoder is configured to decode the data of the superposition-coded signal to generate the information bits and the first parity bits based on the parity check matrix.

3. The receiver of claim 2, wherein the parity check matrix comprises:
    a first parity check matrix comprising a first information sub-matrix and a first parity sub-matrix corresponding to the dual diagonal matrix;
    a second parity check matrix comprising a second information sub-matrix and a second parity sub-matrix corresponding to the identity matrix.

4. The receiver of claim 3, wherein the first decoder is configured to generate the information bits and the first parity bits based on the first parity check matrix or the first parity check matrix and at least a part of the second parity check matrix.

5. The receiver of claim 3, wherein the first decoder is configured to generate the information bits and the first parity bits based on the parity check matrix or a part of the parity check matrix before a number of iterations exceeds a predetermined number during the decoding, and generate the information bits and the first parity bits based on the first parity check matrix after the number of iterations exceeds the predetermined number.

6. The receiver of claim 3, wherein the first decoder is configured to generate the information bits and the first parity bits based on the first parity check matrix and at least one sub-matrix among a plurality of sub-matrixes of the second parity check matrix.

7. The receiver of claim 6, wherein the plurality of sub-matrixes comprise the second parity sub-matrix and a part of the second information sub-matrix.

8. The receiver of claim 3, wherein the encoder is configured to encode the information bits and the first parity bits based on the second parity check matrix to generate the second parity bits corresponding to the second parity sub-matrix.

9. The receiver of claim 8, wherein based on an LDPC syndrome value satisfying a predetermined value according to a syndrome check result with respect to the information bits and the first parity bits based on the first parity check matrix, the encoder is configured to encode the information bits and the first parity bits based on the second parity check matrix to generate the second parity bits corresponding to the second parity sub-matrix.

10. The receiver of claim 1, wherein the parity check matrix differs from a parity check matrix used by the second decoder to generate the bits corresponding to the second layer signal.

11. A method for receiving a superposition-coded signal, the method comprising:
    decoding data of the superposition-coded signal to generate information bits corresponding to a first layer signal of the superposition-coded signal based at least a part of a parity check matrix of a low density parity check (LDPC) code;
    encoding the information bits and first parity bits to generate second parity bits based on at least a part of the parity check matrix;
    interleaving bits of a codeword comprising the information bits, the first parity bits and the second parity bits;
    mapping the interleaved bits of the codeword to constellation points and;
    decoding data of a second layer signal to generate bits corresponding to the second layer signal,
    wherein the second layer signal is obtained by removing a signal which is generated based on the constellation points, from the superposition-coded signal, and
    wherein the parity check matrix comprises a dual diagonal matrix corresponding to the first parity bits and an identity matrix corresponding to the second parity bits.

12. The method of claim 11, wherein the decoding the data of the superposition-coded signal comprises:
   decoding the superposition-coded signal to generate the information bits and the first parity bits based on the parity check matrix.

13. The method of claim 12, wherein the parity check matrix comprises:
   a first parity check matrix comprising a first information sub-matrix and a first parity sub-matrix corresponding to the dual diagonal matrix;
   a second parity check matrix comprising a second information sub-matrix and a second parity sub-matrix corresponding to the identity matrix.

14. The method of claim 13, wherein the decoding the superposition-coded signal comprises:
   decoding the superposition-coded signal to generate the information bits and the first parity bits based on the first parity check matrix or the first parity check matrix and at least a part of the second parity check matrix.

15. The method of claim 13, wherein the decoding the superposition-coded signal comprises:
   decoding the superposition-coded signal to generate the information bits and the first parity bits based on the parity check matrix or a part of the parity check matrix before a number of iterations exceeds a predetermined number during the decoding, and generate the information bits and the first parity bits based on the first parity check matrix after the number of iterations exceeds the predetermined number.

16. The method of claim 13, wherein the decoding the superposition-coded signal comprises:
   decoding the superposition-coded signal to generate the information bits and the first parity bits based on the first parity check matrix and at least one sub-matrix among a plurality of sub-matrixes of the second parity check matrix.

17. The method of claim 16, wherein the plurality of sub-matrixes comprise the second parity sub-matrix and a part of the second information sub-matrix.

* * * * *